(12) United States Patent
Cader et al.

(10) Patent No.: US 9,651,275 B2
(45) Date of Patent: May 16, 2017

(54) ADIABATIC COOLING UNIT

(71) Applicant: HEWLETT PACKARD ENTERPRISE DEVELOPMENT LP, Houston, TX (US)

(72) Inventors: Tahir Cader, Liberty Lake, WA (US); Ernesto Ferrer, Aguadilla, PR (US); Matthew R Slaby, Houston, TX (US); Wade D Vinson, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/233,449

(22) Filed: Aug. 10, 2016

(65) Prior Publication Data
US 2016/0348940 A1    Dec. 1, 2016

Related U.S. Application Data

(62) Division of application No. 13/347,958, filed on Jan. 11, 2012, now Pat. No. 9,429,335.

(51) Int. Cl.
*F24F 13/04* (2006.01)
*F24F 13/08* (2006.01)
(Continued)

(52) U.S. Cl.
CPC .............. *F24F 13/04* (2013.01); *F24F 13/08* (2013.01); *F24F 13/15* (2013.01);
(Continued)

(58) Field of Classification Search
None
See application file for complete search history.

(56) References Cited

U.S. PATENT DOCUMENTS 7,753,766 B2    7/2010  Master et al.
7,903,404 B2    3/2011  Tozer et al.
(Continued)

FOREIGN PATENT DOCUMENTS

TW        201042434       12/2010
WO    WO2011073668        6/2011
WO    WO2011148175       12/2011

OTHER PUBLICATIONS

Unknown, "Data Centres and Renewable Energy Project," Retrieved on Dec. 19, 2011, from http://www.esru.strath.ac.uk/EandE/Web_sites/09-10/Data_centres/Cooling_Approaches.html, 4 pps.

*Primary Examiner* — Gregory Huson
*Assistant Examiner* — Eric Gorman
(74) *Attorney, Agent, or Firm* — Brooks, Cameron & Huebsch, PLLC

(57) ABSTRACT

Examples described herein relate to adiabatic cooling units. For example, a method for mixing gases within an adiabatic cooling unit includes allowing a first gas at a first temperature to enter a mixing chamber on a non-exposed side of an adiabatic cooling media and utilizing a first baffle to direct the first gas in a direction away from the adiabatic cooling media. The method includes allowing a second gas at a second temperature to enter the mixing chamber on an exposed side of the adiabatic cooling media and allowing the first gas and the second gas to mix in the mixing chamber creating a mixed gas. The method also includes creating an inlet with the first baffle and a second baffle to direct the mixed gas away from the adiabatic cooling media and allowing the mixed gas to enter through the exposed side of the adiabatic cooling media.

9 Claims, 4 Drawing Sheets

(51) Int. Cl.
- *H05K 7/20* (2006.01)
- *F24F 13/15* (2006.01)
- *F25B 13/00* (2006.01)
- *B23P 19/04* (2006.01)
- *F24F 7/08* (2006.01)
- *F24F 13/30* (2006.01)
- *F28D 19/04* (2006.01)
- *G06F 1/20* (2006.01)
- *F24F 11/00* (2006.01)
- *F24F 13/22* (2006.01)

(52) U.S. Cl.
CPC ..... H05K 7/20145 (2013.01); H05K 7/20745 (2013.01); *F24F 2011/0082* (2013.01); *F24F 2013/221* (2013.01); *Y02B 30/542* (2013.01); *Y10T 137/0318* (2015.04)

(56) References Cited

U.S. PATENT DOCUMENTS

| | | |
|---|---|---|
| 8,054,625 B2 | 11/2011 | Noteboom et al. |
| 9,380,731 B2 * | 6/2016 | Faig Palomer .... H05K 7/20745 |
| 2005/0225936 A1 | 10/2005 | Day |
| 2008/0185446 A1 | 8/2008 | Tozer |
| 2008/0305733 A1 | 12/2008 | Noteboom et al. |
| 2009/0059523 A1 | 3/2009 | Mallia |
| 2010/0136895 A1 | 6/2010 | Sgro |
| 2010/0263825 A1 * | 10/2010 | Noteboom ......... H05K 7/20736 165/47 |
| 2010/0297512 A1 | 11/2010 | Shinoda |
| 2013/0174597 A1 * | 7/2013 | Cader .................... F24F 13/04 62/324.1 |

* cited by examiner

ADIABATIC COOLING UNIT

CROSS REFERENCE TO RELATED APPLICATIONS

This application is a divisional of, and claims priority to, co-pending U.S. application Ser. No. 13/347,958, entitled "ADIABATIC COOLING UNIT," filed on 11 Jan. 2012.

BACKGROUND

Adiabatic cooling media can be used to cool air passing through the media. The air passing through the adiabatic cooling media can be required to be within a particular temperature range prior to entering the adiabatic media. Air at a temperature outside the particular range can potentially damage the adiabatic media.

DETAILED DESCRIPTION

Figure 1:
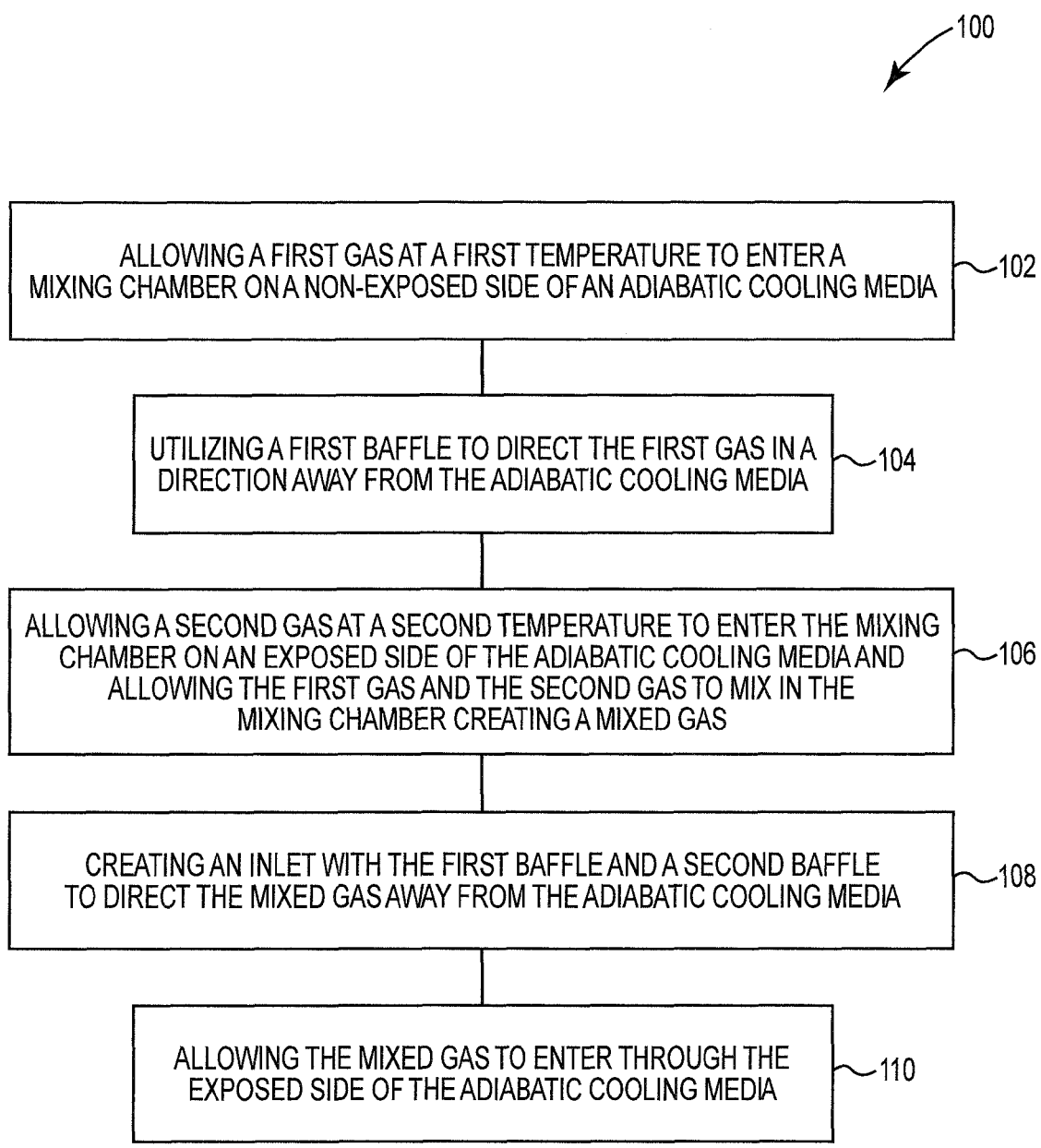
FIG. 1 is a flow chart illustrating an example method for mixing gases within an adiabatic cooling unit according to the present disclosure.

Examples of the present disclosure include methods and systems for mixing gases within an adiabatic cooling unit. Methods and systems for mixing gases within an adiabatic cooling unit can include allowing a first gas at a first temperature to enter a mixing chamber on a non-exposed side of an adiabatic cooling media. Mixing gases within an adiabatic cooling unit also can include utilizing a first baffle to direct the first gas in a direction away from the adiabatic cooling media. Mixing gases within an adiabatic cooling unit also can include allowing a second gas at a second temperature to enter the mixing chamber on an exposed side of the adiabatic cooling media and allowing the first gas and the second gas to mix in the mixing chamber creating a mixed gas. Mixing gases within an adiabatic cooling unit also can include creating an inlet with the first baffle and a second baffle to direct the mixed gas away from the adiabatic cooling media. Furthermore, mixing gases within an adiabatic cooling unit can include allowing the mixed gas to enter through the exposed side adiabatic cooling media.

In the following detailed description of the present disclosure, reference is made to the accompanying drawings that form a part hereof, and in which is shown by way of illustration how examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 320 may reference element "20" in FIG. 3, and a similar element may be referenced as 420 in FIG. 4. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

FIG. 1 is a flow chart illustrating an example method 100 for mixing gases within an adiabatic cooling unit, according to the present disclosure. For example, two gases of different temperatures can enter a mixing chamber within the adiabatic cooling unit and when mixed can produce a temperature that is within an acceptable range for entering an adiabatic media. Mixing of the two gases can be beneficial before the two gases enter the adiabatic media. For example, each of the two gases individually may be at a temperature that is outside an acceptable range for entering an adiabatic media. Gases that are outside the acceptable range for entering the adiabatic media could potentially damage the adiabatic media.

The adiabatic media can act as a cooling agent for gas that is passing through the adiabatic media. The adiabatic media can cool the gas passing through by a number of different adiabatic processes. For example, an adiabatic media can use a humidification process to cool the gas passing through. In a different example an adiabatic media can perform a spray process, wherein water droplets are sprayed into the gas passing through the media.

At 102, a first gas at a first temperature can be allowed to enter a mixing chamber on a non-exposed side of an adiabatic cooling media. The first gas at the first temperature can also have a first relative humidity. The non-exposed side of the adiabatic media can be a side that does not allow gas to pass through or is not being utilized to allow a gas to pass through. The first gas can be allowed into the mixing chamber via a set of louvers. A set of louvers can comprise a set of slats that are positioned vertically or horizontally, or otherwise. The slats can be positioned to create openings to allow gas into the mixing chamber. The slats can be moved to allow an increased or decreased amount of gas into the mixing chamber. The louvers can be controlled by a control box. The control box can increase and/or decrease the area that allows the first gas at a first temperature into the mixing chamber.

At 104, a first baffle can be utilized to direct the first gas away from the adiabatic cooling media. The first gas can be directed away from the adiabatic cooling media utilizing a first baffle to prevent the first gas from entering the adiabatic cooling media before mixing with a second gas at a second temperature. The second gas at the second temperature can have a second relative humidity. The mixed gas can enter the adiabatic media through an exposed side of the adiabatic media. The exposed side of the adiabatic media can be the side that allows a gas to pass through or is being utilized to allow a gas to pass through. For example, if a barrier blocks a as from entering a particular side of the adiabatic media, then the side that is blocked by the barrier can be the non-exposed side and the side that allows the gas to pass through can be the exposed side of the adiabatic media.

The entering of the first gas into the exposed side of the adiabatic cooling media without mixing can cause damage to the adiabatic cooling media. For example, if the first gas is not within an acceptable temperature range for the adiabatic cooling media, then the adiabatic cooling media can be damaged. For example, if the first gas is outside air that is below the freezing temperature of water, then the gas at a first temperature could potentially freeze the adiabatic cooling media if the air was not mixed properly with a gas that had a warmer temperature. The entering of the first gas into the exposed side of the adiabatic cooling media without mixing can also result in the adiabatic cooling media changing the first gas to a temperature that can damage temperature sensitive equipment (e.g., data center equipment). For example, if the adiabatic cooling unit is connected to a data center with temperature sensitive equipment, the entering of the first gas into the adiabatic media without mixing can result in a gas entering the data center that can damage the temperature sensitive equipment.

To avoid the first gas directly entering the adiabatic cooling media without mixing with a second gas, the first baffle can be connected to a top portion of the exposed side of the adiabatic media. The first baffle can direct the first gas away from an exposed side of the adiabatic cooling media. The first baffle can also direct the first gas to a point in the mixing chamber lower than the adiabatic cooling media. The first gas can be exterior air below the freezing temperature of water and follow the baffle to a point in the mixing chamber lower than the adiabatic cooling media. The first gas can mix with a second gas before entering the exposed side of the adiabatic cooling media. For example, if the first gas is cold exterior air, it can sink to the bottom of the mixing chamber and once below the adiabatic cooling media the first gas can mix with the second gas before moving upwards toward the exposed side of the adiabatic cooling media.

At 106, a second gas at a second temperature can be allowed to enter the mixing chamber on the exposed side of the adiabatic cooling media and the first gas and the second gas can be allowed to mix and create a mixed gas. The second gas can enter the mixing chamber through louvers. The louvers can be analogous to the louvers that allowed the first gas into the mixing chamber. The louvers that allow the first gas and the second gas into the mixing chamber can be controlled electronically through a control box (e.g., control circuitry). The control box can control the amount of each gas entering the mixing chamber by opening and closing portions of the louvers. The control box can allow a proportional amount of the first gas and the second gas into the mixing chamber. The control box can determine the proportionality based on a number of factors (e.g., the first temperature and first relative humidity, and/or the second temperature and the second relative humidity). The louvers that allow the second gas to enter the mixing chamber can be located at a position lower than the adiabatic media.

The second gas can be at a temperature warmer than the first gas. The second gas can be at a temperature (e.g., greater than 90 degrees Fahrenheit) that can damage the adiabatic media if it enters before mixing with a gas at a colder temperature. The second gas can enter the mixing chamber and rise and mix with the first gas before entering the adiabatic media. For example, if the first gas is colder than the second gas, then the colder gas can be directed by the first baffle away from the exposed side of the adiabatic media to a point in the mixing chamber lower than the adiabatic media. In the same example, the warmer gas can rise in the mixing chamber and mix with the colder gas prior to entering the exposed side of the adiabatic media. The mixing of the first gas and the second gas can create a mixed gas.

At 108, the first baffle and a second baffle can create an inlet to direct the mixed gas away from the adiabatic cooling media. The inlet can be at an angle away from the exposed side of the adiabatic media. The angle of the first baffle and the second baffle can be the same (e.g., 30 degrees from the exposed side of the adiabatic media). A portion of the first baffle and a portion of the second baffle can be substantially parallel to create the inlet. Substantially parallel can mean being within 20° of parallel.

The first baffle can include perforations on the portion of the first baffle that creates the inlet with the portion of the second baffle. The second baffle can also include perforations on the portion of the second baffle that creates the inlet with the portion of the first baffle. The perforations on the portion of the first baffle can correspond to a solid area of the portion of the second baffle and the perforations on the second baffle can correspond to a solid area on the portion of the first baffle.

The first baffle and the second baffle can comprise an insulated material. The insulated material can prevent a rain effect. The insulated material can comprise any material that can be used as an insulator (cellulose fiber, polyurethane, fiberglass, or similar material). A rain effect or condensation can occur when cold air mixes with warm air. The moisture from the warm air can condense on surfaces and produce water droplets. The water droplets can build up on the surfaces and drip therefrom. The rain effect or water condensation can damage equipment within the adiabatic cooling unit, as well as damage equipment in the connected designated area (e.g., data center). For example, if a data center is located below the adiabatic cooling unit, droplets of water could potentially drip from the adiabatic cooling unit into the data center, damaging electrical equipment contained therein.

At 110, the mixed gas can be allowed through the exposed side of the adiabatic cooling media. The mixed gas can be allowed through the exposed side of the adiabatic cooling media to the non-exposed side of the adiabatic cooling media and exit the adiabatic cooling unit through an exhaust fan. The adiabatic cooling media can lower the temperature of the mixed gas by utilizing an adiabatic process. The adiabatic cooling unit can be connected to a data center and the exhaust fan can be connected to a cold aisle of the data center. The cold aisle of the data center can include an area of the data center that is designated for cooler air to reach the electrical equipment of the data center. The adiabatic cooling unit can be connected above the data center. For example, the adiabatic cooling unit can be connected to the roof of the data center.

Figure 2:
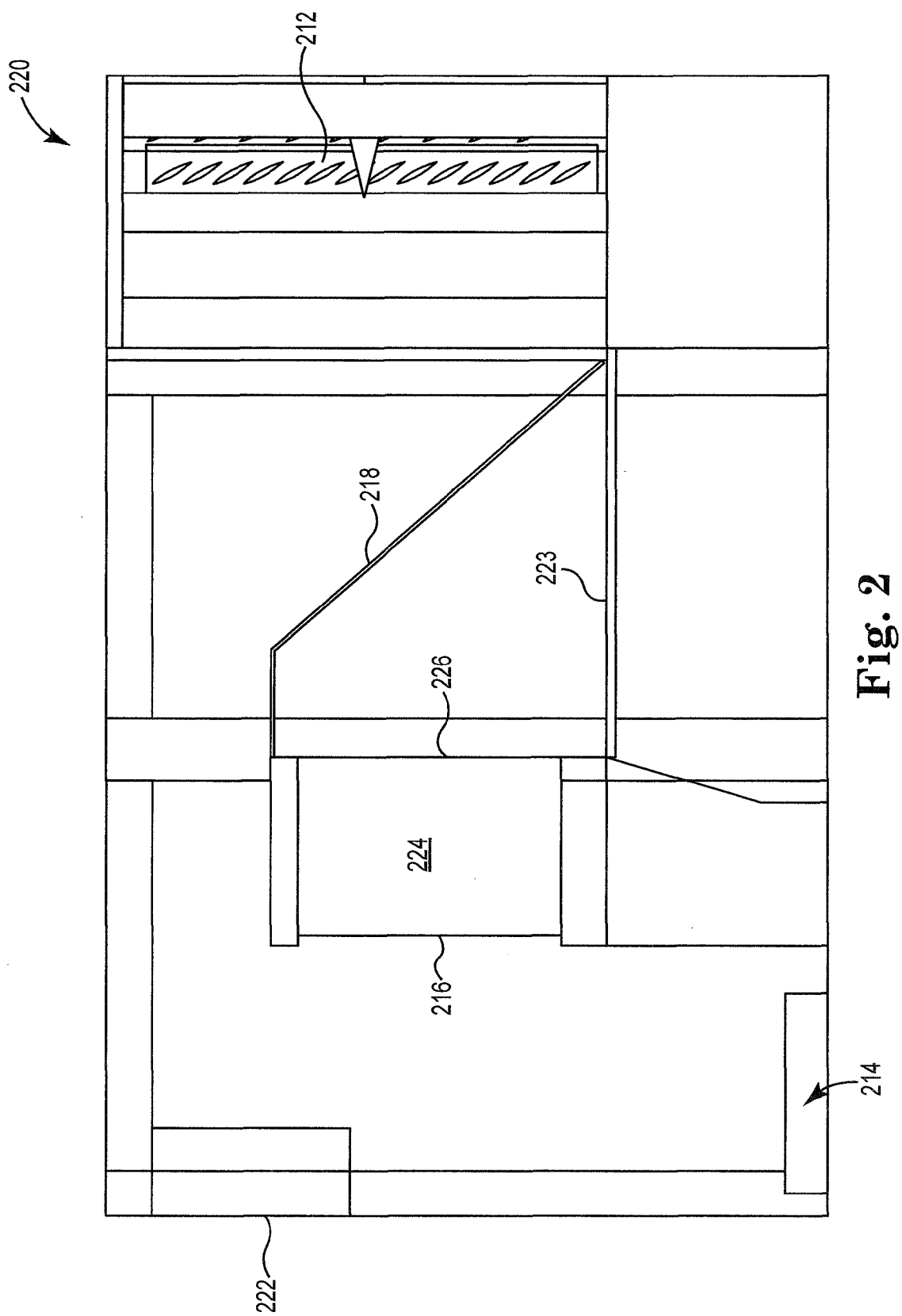
FIG. 2 illustrates a diagram representing an example of an adiabatic cooling unit without a set of baffles.

FIG. 2 illustrates a diagram representing an example of an adiabatic cooling unit 220 without a set of baffles. Adiabatic cooling unit 220 can allow a first gas with a first temperature into the mixing chamber through a first set of louvers 212. For example, the first set of louvers 212 can allow outside air into the mixing chamber, in this example the outside air can be relatively cold (e.g., 10° F. (−12.2° C.), 0° F. (−17.1° C.), −30° F. (−34.4° C.)). The first set of louvers 212 can allow the first gas into the mixing chamber in various amounts based on the space between the first set of louvers 212. The first set of louvers 212 can be electronically controlled through a control box 222. The control box 222 can control the first set of louvers 212 to allow in sufficient amounts of the first gas in order to provide a proper mixing. Sufficient amounts of the first gas will vary based on the desired temperature of the mixed gas and the temperature of a second gas at a second temperature. The desired temperature of the mixed gas can relate to the type of adiabatic media utilized in the adiabatic cooling unit.

The first set of louvers 212 can be located on the non-exposed side 226 of the adiabatic media 224. The non-exposed side 226 of the adiabatic media 224 can be protected by a barrier 218. The barrier 218 can direct the first gas above the adiabatic media 224 until it reaches the exposed side 216 of the adiabatic media 224.

A second set of louvers 214 can allow a second gas at a second temperature into the mixing chamber. The second gas can be the air from a hot aisle of a data center. Data centers can be large areas containing multiple servers and can produce large amounts of heat. The second temperature of the second gas can be relatively hot (e.g., 80° F. (26.7° C.), 110° F. (43.3° C.), 115° F. (46.1° C.)). The second set of louvers 214 can be located on the exposed side 216 of the adiabatic media 224 at a position lower than the adiabatic media 224.

The first gas and the second gas can mix to produce a mixed gas prior to entering the exposed side 216 of the adiabatic media 224. The mixed gas can be a temperature that is between the first temperature and the second temperature (e.g., 20° F.-112° F. (−6.7° C.-44.5° C.)). After the mixed gas has entered the adiabatic media the mixed can pass into an exit blower 223. The exit blower 223 can be a cold aisle blower for a data center.

Figure 3:
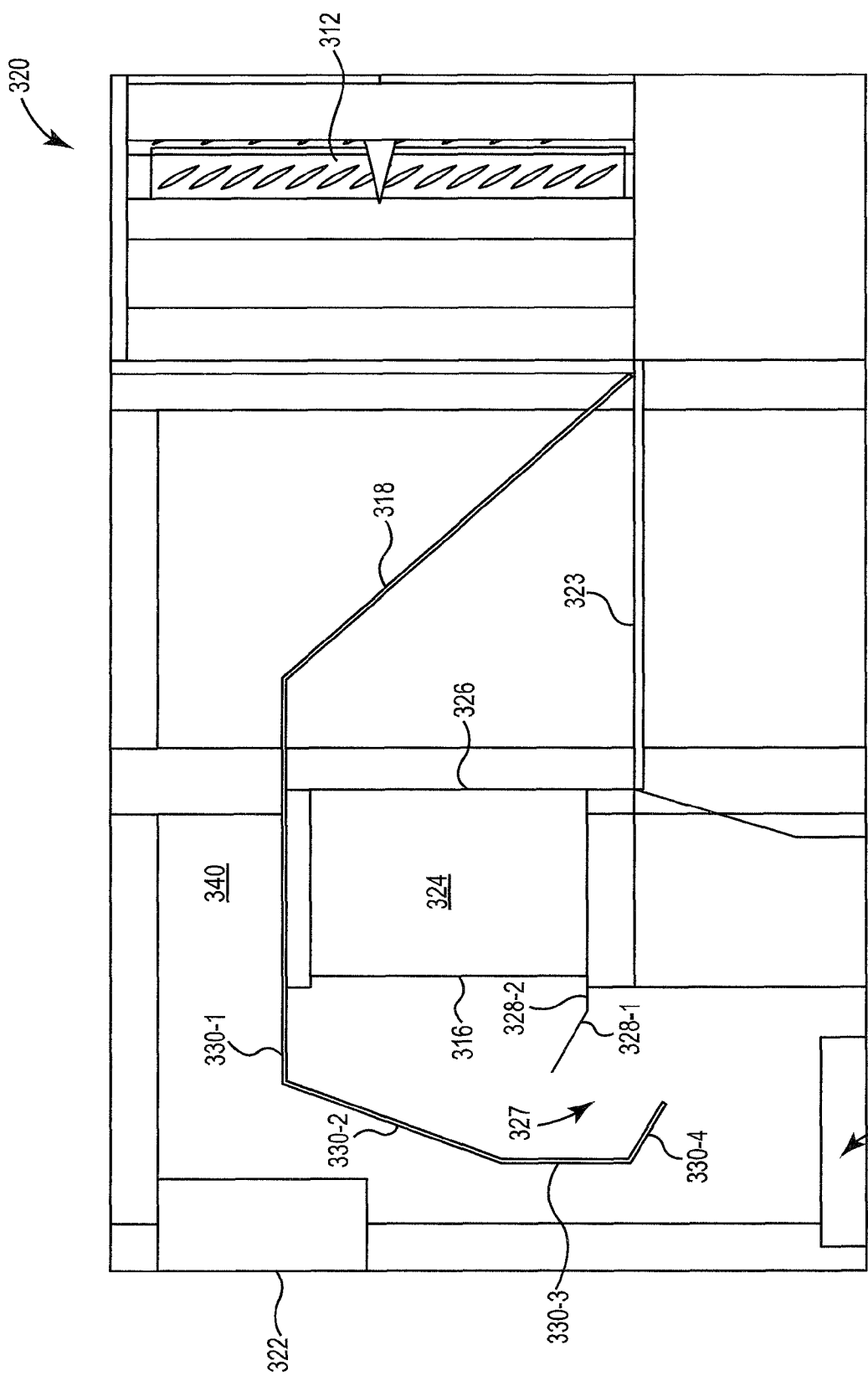
FIG. 3 illustrates a diagram representing an example of an adiabatic cooling unit with a set of baffles, according to the present disclosure.

FIG. 3 illustrates a diagram representing an example of an adiabatic cooling unit 320 with a set of baffles, according to the present disclosure. Adiabatic cooling unit 320 can allow a first gas with a first temperature into the mixing chamber through a first set of louvers 312. As described herein, the first set of louvers 312 can allow outside air into the mixing chamber. The outside air can be relatively cool (e.g., 45° F. (7.2° C.), 0° F. (−17.1° C.), −30° F. (−34.4° C.)). The first set of louvers 312 can allow the first gas into the mixing chamber in various amounts based on the space between the first set of louvers 312. The first set of louvers can be electronically controlled through a control box 322. The control box 322 can control the first set of louvers 312 to allow in sufficient amounts of the first gas in order to provide a proper mixing. Sufficient amounts of the first gas will vary based on the desired temperature of the mixed gas and the temperature of a second gas at a second temperature.

The first set of louvers 312 can be located on the non-exposed side 326 of the adiabatic media 324. The non-exposed side 326 of the adiabatic media 324 can be protected by a barrier 318.

The barrier 318 can direct the first gas above the adiabatic media 324 until it reaches a first portion of a first baffle 330-1. The first portion of the first baffle can be connected to a top portion of the adiabatic media 324 on the exposed side 316. The first portion of the first baffle 330-1 can extend beyond the exposed side 316 of the adiabatic media (e.g., 8 inches). The first portion of the first baffle 330-1 can extend substantially perpendicular to the exposed side 316 of the adiabatic media 324. The exposed side 316 of the adiabatic media 324 can create a desired angle (e.g., 90°). Substantially perpendicular can mean being within 20° of perpendicular.

The first portion of the first baffle 330-1 can be connected to a second portion of the first baffle 330-2. The second portion of the first baffle 330-2 can be angled away from the exposed side 316 of the adiabatic media 324 (e.g., at 20°). The second portion of the first baffle 330-2 can extend outward from the first portion of a first baffle for a determined distance (e.g., 20 inches). The first portion of the first baffle and the second portion of the first baffle can create a desired angle (e.g., 110°). The second portion of the first baffle 330-2 can be connected to a third portion of the first baffle 330-3.

The third portion of the first baffle 330-3 can extend substantially parallel to the exposed side 316 of the adiabatic media 324. Substantially parallel can mean being within 20° of parallel. The third portion of the first baffle 330-3 can extend from the second portion of the first baffle 330-2 for a determined distance (e.g., 11 inches). The third portion of the first baffle 330-3 can extend a distance to a position that is lower than the adiabatic media 324. The second portion of the first baffle and the third portion of the first baffle can create a desired angle (e.g., 70°). The third portion of the first baffle 330-3 can be connected to a fourth portion of the first baffle 330-4.

The fourth portion of the first baffle 330-4 can extend toward the adiabatic media 324 to create a desired angle with the third portion of the first baffle 330-3 (e.g., 120°). The fourth portion of the first baffle 330-4 can extend to a desired distance (e.g., 6 inches) in the direction creating the desired angle with the third portion of the first baffle 330-3 (e.g., 120°). The fourth portion of the first baffle 330-4 can also include perforations.

The fourth portion of the first baffle 330-4 can create an inlet 327 with two portions of a second baffle 328-1, 328-2. A first portion of the second baffle 328-1 can be connected to a second portion of the second baffle 328-2 that can be connected to a bottom portion of the exposed side 316 of the adiabatic media 324. The first portion of the second baffle can be substantially parallel to the fourth portion of the first baffle 330-4. Substantially parallel can mean being within 20° of parallel. The first portion of the second baffle can extend from the second portion of the second baffle for a desired distance (e.g., 6 inches). The first portion of the second baffle can be at an angle from the exposed side 316 of the adiabatic media 324 (e.g., at 60°). The first portion of the second baffle can include perforations.

The second portion of the second baffle 328-2 can be connected to the first portion of the second baffle 328-1 and further connected to the bottom portion of the adiabatic media 324. The second portion of the second baffle 328-2 can extend away from the exposed side 316 of the adiabatic media 324 for a desired distance (e.g., 2 inches).

A second set of louvers 314 can allow a second gas at a second temperature into the mixing chamber. For example, the second gas can be the air from a hot aisle of a data center. The hot aisle of a data center can be heat that is directed away from the electrical equipment into the adiabatic cooling unit. Data centers can be large areas containing multiple servers and can produce large amounts of heat. The second temperature of the second gas can be relatively warm (e.g., 80° F. (26.7° C.), 110° F. (43.3° C.), 115° F. (46.1° C.)). The second set of louvers 314 can be located on the exposed side 316 of the adiabatic media 324 at a position lower than the adiabatic media 324. The second set of louvers 314 can be on a side of a first baffle that is farther away from the adiabatic media 324.

The first gas and the second gas can mix to produce a mixed gas prior to entering the exposed side 316 of the adiabatic media 324. The mixed gas can be at a temperature that is between the first temperature and the second temperature (e.g., 40.7° F.-87.5° F. (4.8° C.-30.8° C.)).

The mixed gas can pass through an inlet 327 before entering the adiabatic media. The inlet 327 can be formed by the fourth portion of the first baffle 330-4 and the first portion of the second baffle 328-1. The inlet can be at an angle (e.g., 30°) that is away from the exposed side 316 of the adiabatic media 324.

After the mixed gas has entered the adiabatic media 324 the mixed gas can pass into an exit blower 323. The exit blower 323 can be a cold aisle blower for a data center.

Figure 4:
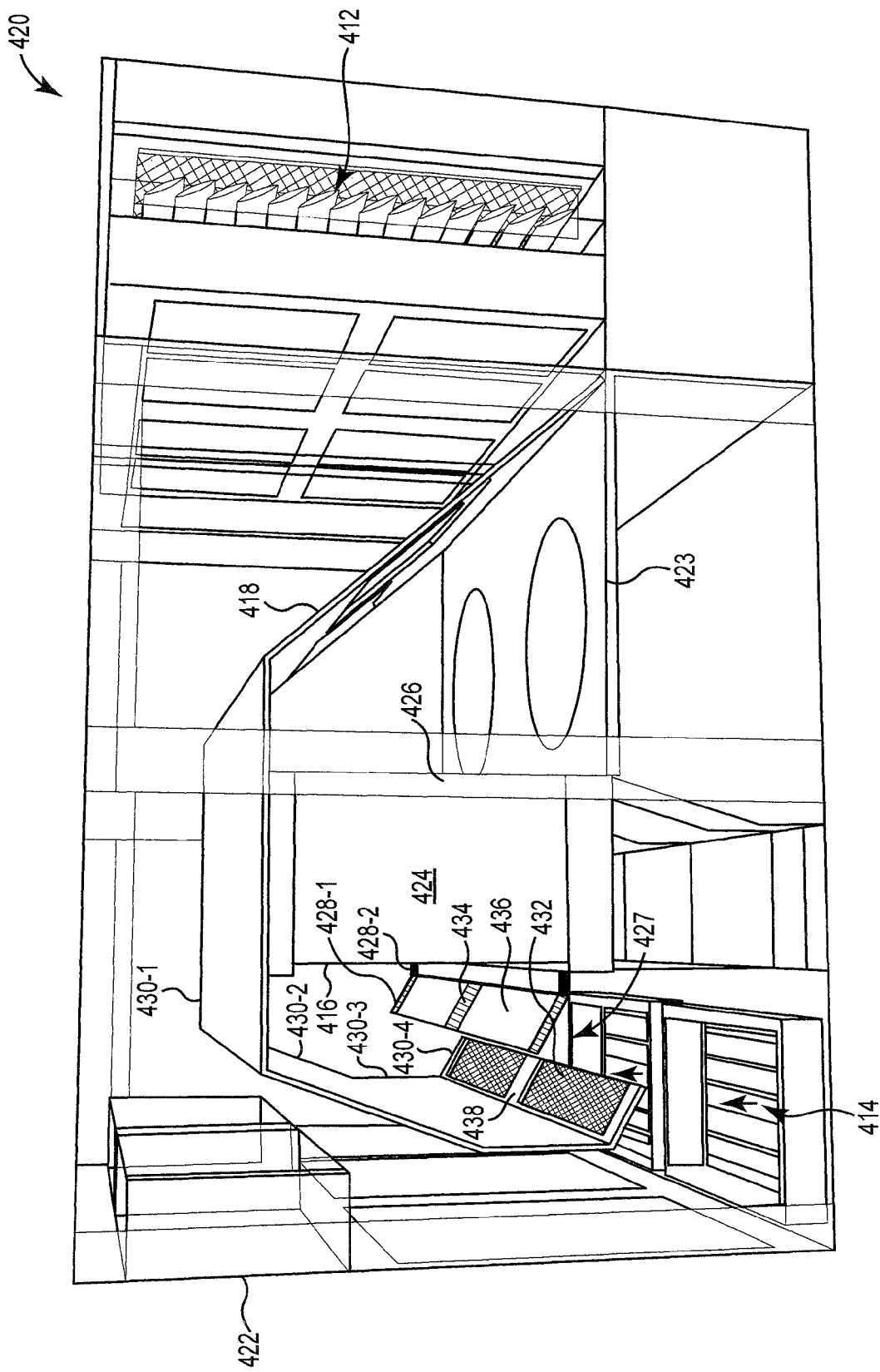
FIG. 4 illustrates a three dimensional diagram representing an example of the adiabatic cooling unit with a set of baffles illustrated in FIG. 3, according to the present disclosure.

FIG. 4 illustrates a three dimensional diagram representing an example of the adiabatic cooling unit with a set of baffles illustrated in FIG. 3, according to the present disclosure. Adiabatic cooling unit 420 can allow a first gas at a first temperature into the mixing chamber through the first set of louvers 412. As described herein, the first set of louvers 412 can allow outside air into the mixing chamber. The first set of louvers can be electronically controlled through the control box 422. The control box 422 can control the first set of louvers 412 to allow in air at sufficient amounts for a given specification (e.g., proper mixing, mixed gas temperature, adiabatic media specifications).

The first set of louvers 412 can be located on the non-exposed side 426 of the adiabatic media 424. The non-exposed side 426 of the adiabatic media 424 can be protected by the barrier 418. The barrier 418 can direct the first gas above the adiabatic media 424 until it reaches a set of portions of a first baffle 430-1, 430-2, 430-3, 430-4. The baffles can be connected as described herein.

A fourth portion of the first baffle 430-4 can include perforations 432 and solid areas 438. The first portion of the second baffle 428-1 can include perforations 434 and solid areas 436. The perforations 432 on the fourth portion of the first baffle 430-4 can line up with solid areas 436 on a first portion of a second baffle 428-1. The solid areas 438 of the fourth portion of the first baffle 430-4 can line up with perforations 434 on the first portion of the second baffle 428-1. The perforations 432 on the fourth portion of the first baffle 430-4 and the perforations 434 on the first portion of the second baffle 428-1 can allow a percentage (e.g., 50 percent) of a gas to pass through. For example, 50 percent of the solid material comprising the baffle can be removed to create the perforations.

The first portion of the second baffle 428-1 can be connected to the second portion of the second baffle 428-2 that can be connected to a bottom portion of the exposed side 416 of the adiabatic media 424. The first portion of the second baffle 428-1 can be substantially parallel to the fourth portion of the first baffle 430-4. Substantially parallel can mean being within 20° of parallel.

The second set of louvers 414 can allow a second gas at a second temperature into the mixing chamber. The second set of louvers 414 can be located on the exposed side 416 of the adiabatic media 424 at a position lower than the adiabatic media 424. The second set of louvers 414 can be on a side of the first baffle that is on an opposite side of the adiabatic media 424. The first gas and the second gas can mix to produce a mixed gas prior to entering the exposed side 416 of the adiabatic media 424. The mixed gas can pass through an inlet 427 before entering the adiabatic media. The inlet 427 can be formed by the fourth portion of the first baffle 430-4 and the first portion of the second baffle 428-1. The inlet can be at an angle (e.g., 30°) that is away from the exposed side 416 of the adiabatic media 424.

After the mixed gas has entered the adiabatic media, the mixed gas can pass into an exit blower 423. For example, the exit blower 423 can be a cold aisle blower for a data center.

Table 1 describes some of the performance results that can be obtained from an adiabatic cooling unit with a set of baffles as described herein and without a set of baffles as described herein.

TABLE 1

Adiabatic Unit Performance

| Model | | Without Baffles | With Baffles |
|---|---|---|---|
| Air Mix Ratio | Outside Air | 31% | 31% |
| | Return Air | 69% | 69% |
| Air Temperature (F.) | Outside Air | −15 | −15 |
| | Return Air | 101 | 101 |
| Media Inlet | Minimum | 20 | 40.7 |
| Temperature (F.) | Maximum | 111.6 | 87.4 |
| Media Inlet Pressure | Minimum | −0.043 | −0.147 |
| (inH2O) | Maximum | −0.015 | −0.021 |
| Pressure Drop (inH2O) | | 0.003 | 0.084 |

Table 1 represents computational fluid dynamic analysis results of an adiabatic cooling unit with a set of baffles and without a set of baffles, as described herein. The air mix ratio can be the mix between the colder outside air and the warmer return air from the inside of a data center. The ratio of outside air and return air was kept consistent in the tests, wherein the outside air was at 31 percent and the return air was 69 percent of the total mixed air.

The air temperature was recorded in degrees Fahrenheit (° F.) and is converted to degrees Celsius (° C.) using a conversion factor that may contain rounding. The air temperature of the outside air in this example was −15° F. (−26.1° C.). The air temperature of the return air in this example was 101° F. (38.3° C.).

The media inlet temperature can represent the temperature of the mixed gas entering the adiabatic media. The media inlet temperature can be described through a range of a maximum and a minimum temperature due to an uneven mixing of the outside air and return air. The media inlet temperature range can be configured to the specifications of the adiabatic cooling unit. For example, the desired media inlet temperature range can be different for various adiabatic media. In a different example, the desired media inlet temperature can be different for different data center specifications.

In the adiabatic unit without baffles as described herein, the range of temperatures was 20° F. to 111.6° F. (−6° C. to 44.2° C.). In the adiabatic unit with the set of baffles as described herein, the range of temperatures was 40.7° F. to 87.4° F. (4.8° C. to 30.78° C.). As described herein, temperatures near the freezing point of water (32° F.) and above 95° F. can potentially damage the adiabatic cooling media. For this reason it is advantageous to ensure good mixing between the outside air and the return air from the data center.

The media inlet pressure is presented in inches of water (inH$_2$O) and is converted to atmospheres (atm) using a conversion factor, wherein rounding may be involved. The media inlet pressure is affected by barriers within the adiabatic cooling unit that prevent the air from moving directly into the adiabatic cooling media and through the exhaust. If the pressure drop in the adiabatic cooling unit is too high, the exhaust fans can have an increase in power consumption with an increase in the pressure drop. Therefore it is advantageous to minimize the pressure drop in order to avoid inefficiency in the adiabatic cooling unit. In this example the pressure drop for the adiabatic cooling unit without baffles was 0.003 inH$_2$O ($7.4 \times 10^{-6}$ atm). By comparison, the pressure drop for the adiabatic cooling unit with the baffles as described herein was 0.084 inH$_2$O ($2.06 \times 10^{-4}$ atm). An acceptable pressure drop can include values lower than 0.100 inH$_2$O.

The specification examples and data provide a description of the method and applications, and use of the system and method of the present disclosure. Since many examples can be made without departing from the spirit and scope of the system and method of the present disclosure, this specification merely sets forth some of the many possible embodiment configurations and implementations.

What is claimed:

1. A method for mixing gases within an adiabatic cooling unit for a data center, comprising:
    allowing a first gas at a first temperature to enter a mixing chamber on a non-exposed side of an adiabatic cooling media;
    utilizing a first baffle to direct the first gas in a direction away from an exposed side of the adiabatic cooling media;
    allowing a second gas at a second temperature to enter the mixing chamber on the exposed side of the adiabatic cooling media and allowing the first gas and the second gas to mix in the mixing chamber creating a mixed gas;
    creating an inlet with the first baffle and a second baffle at a bottom portion of the adiabatic cooling media to direct the mixed gas away from the exposed side of the adiabatic cooling media and toward the first baffle; and
    allowing the mixed gas to enter through the exposed side of the adiabatic cooling media.

2. The method of claim 1, wherein the first temperature is cooler than the second temperature and wherein allowing the first baffle to direct the first gas in a direction away from the adiabatic cooling media comprises allowing the first baffle to direct the first gas above the adiabatic cooling media.

3. The method of claim 1, further comprising controlling, by a first louver, the entry of the first gas and controlling, by a second louver, the entry of the second gas, wherein the entry of the first gas is proportional to the entry of the second gas.

4. The method of claim 1 further comprising utilizing the first baffle and the second baffle, which include an insulated material, to prevent a rain effect.

5. The method of claim 1, wherein the adiabatic cooling unit is connected to the data center and located above the data center.

6. The method of claim 5, further comprising:
    passing the mixed gas through the adiabatic media; and
    delivering, via an exhaust fan, the mixed gas to a cold aisle of the data center.

7. The method of claim 1, wherein the first baffle and the second baffle each include a portion that includes perforations.

8. The method of claim 7, wherein the perforations on the first baffle correspond to a solid area on the second baffle and the perforations on the second baffle correspond to a solid area of the first baffle.

9. The method of claim 7, wherein the perforations allow 50 percent of a gas to pass through the perforations.

* * * * *